(12) United States Patent
Huang et al.

(10) Patent No.: US 11,810,974 B2
(45) Date of Patent: Nov. 7, 2023

(54) SEMICONDUCTOR STRUCTURE WITH TRENCH JUNCTION BARRIER SCHOTTKY (TJBS) DIODE

(71) Applicant: National Tsing Hua University, Hsinchu (TW)

(72) Inventors: Chih-Fang Huang, Hsinchu (TW); Jia-Wei Hu, Hsinchu (TW); You-An Lin, Hsinchu (TW); Yong-Shiang Jan, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 204 days.

(21) Appl. No.: 17/358,693

(22) Filed: Jun. 25, 2021

(65) Prior Publication Data
US 2022/0199825 A1 Jun. 23, 2022

(30) Foreign Application Priority Data

Dec. 17, 2020 (TW) ................................. 109144788

(51) Int. Cl.
*H01L 29/78* (2006.01)
*H01L 29/872* (2006.01)
*H01L 27/095* (2006.01)
*H01L 29/423* (2006.01)

(52) U.S. Cl.
CPC ........ *H01L 29/7813* (2013.01); *H01L 27/095* (2013.01); *H01L 29/4238* (2013.01); *H01L 29/42364* (2013.01); *H01L 29/8725* (2013.01)

(58) Field of Classification Search
CPC ............ H01L 29/7813; H01L 27/095; H01L 29/42364; H01L 29/4238; H01L 29/8725; H01L 29/0696; H01L 29/407; H01L 29/0623; H01L 29/0878; H01L 29/7806; H01L 29/872
See application file for complete search history.

(56) References Cited

U.S. PATENT DOCUMENTS

| | | | |
|---|---|---|---|
| 2012/0146090 A1* | 6/2012 | Lui ..................... | H01L 21/7688 |
| | | | 257/E29.198 |
| 2018/0315848 A1* | 11/2018 | Huang ................ | H01L 29/0623 |
| 2020/0321478 A1* | 10/2020 | Ren ........................ | H01L 29/08 |
| 2020/0388704 A1* | 12/2020 | Tominaga ............ | H01L 29/407 |
| 2022/0130995 A1* | 4/2022 | Lichtenwalner .... | H01L 29/1608 |

FOREIGN PATENT DOCUMENTS

| | | |
|---|---|---|
| CN | 109256427 A | 1/2019 |
| EP | 2259327 A2 | 12/2010 |
| WO | WO-2010008617 A1 | 1/2010 |

\* cited by examiner

*Primary Examiner* — Shahed Ahmed
*Assistant Examiner* — Khatib A Rahman
(74) *Attorney, Agent, or Firm* — Muncy, Geissler, Olds & Lowe, P.C.

(57) ABSTRACT

A semiconductor structure includes: a U-metal-oxide-semiconductor field-effect transistor (UMOS) structure; and a trench junction barrier Schottky (TJBS) diode, wherein an insulating layer of a sidewall of the TJBS diode does not have a side gate.

6 Claims, 7 Drawing Sheets

SEMICONDUCTOR STRUCTURE WITH TRENCH JUNCTION BARRIER SCHOTTKY (TJBS) DIODE

CROSS-REFERENCE TO RELATED APPLICATIONS

This application claims priority of No. 109144788 filed in Taiwan R.O.C. on Dec. 17, 2020 under 35 USC 119, the entire content of which is hereby incorporated by reference.

BACKGROUND OF THE INVENTION

Field of the Invention

The invention relates to a semiconductor structure, and more particularly to a semiconductor structure with a trench junction barrier Schottky (TJBS) diode.

Description of the Related Art

A metal-oxide-semiconductor field-effect transistor (MOSFET) is usually connected to a diode in parallel, and is typically individually packaged onto a circuit board or implemented in a module in a form of an individual chip, thereby increasing the package cost and the sizes of the circuit and module. This disclosure provides a power MOSFET and a diode integrated in the same chip to solve the problem and decrease the cost effectively.

In the prior art, however, the position of the junction Schottky barrier affects the current path. So, the conventional semiconductor structure has the too long current path and thus cannot possess the lower resistance.

BRIEF SUMMARY OF THE INVENTION

An objective of the invention is to provide a semiconductor structure with a TJBS diode capable of providing a current path shorter than that of the prior art and a resistance lower than that of the prior art.

An embodiment of the invention discloses a semiconductor structure including a UMOS structure and a TJBS diode. An insulating layer of a sidewall of the TJBS diode does not have a side gate.

An embodiment of the invention discloses that a current path flowing from a source through a gap is a vertical path.

DETAILED DESCRIPTION OF THE INVENTION

Figure 1:
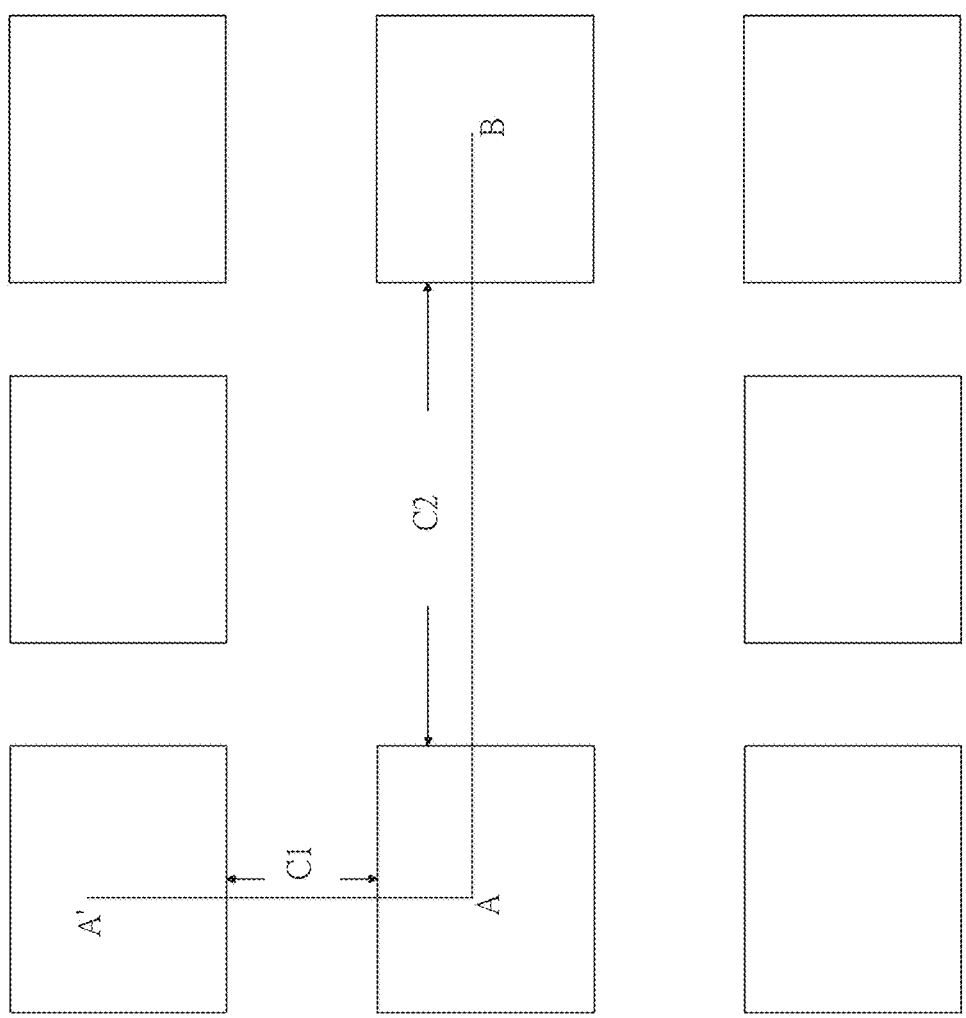
FIG. 1 is a schematic top view showing an embodiment of the invention.
Figure 3:
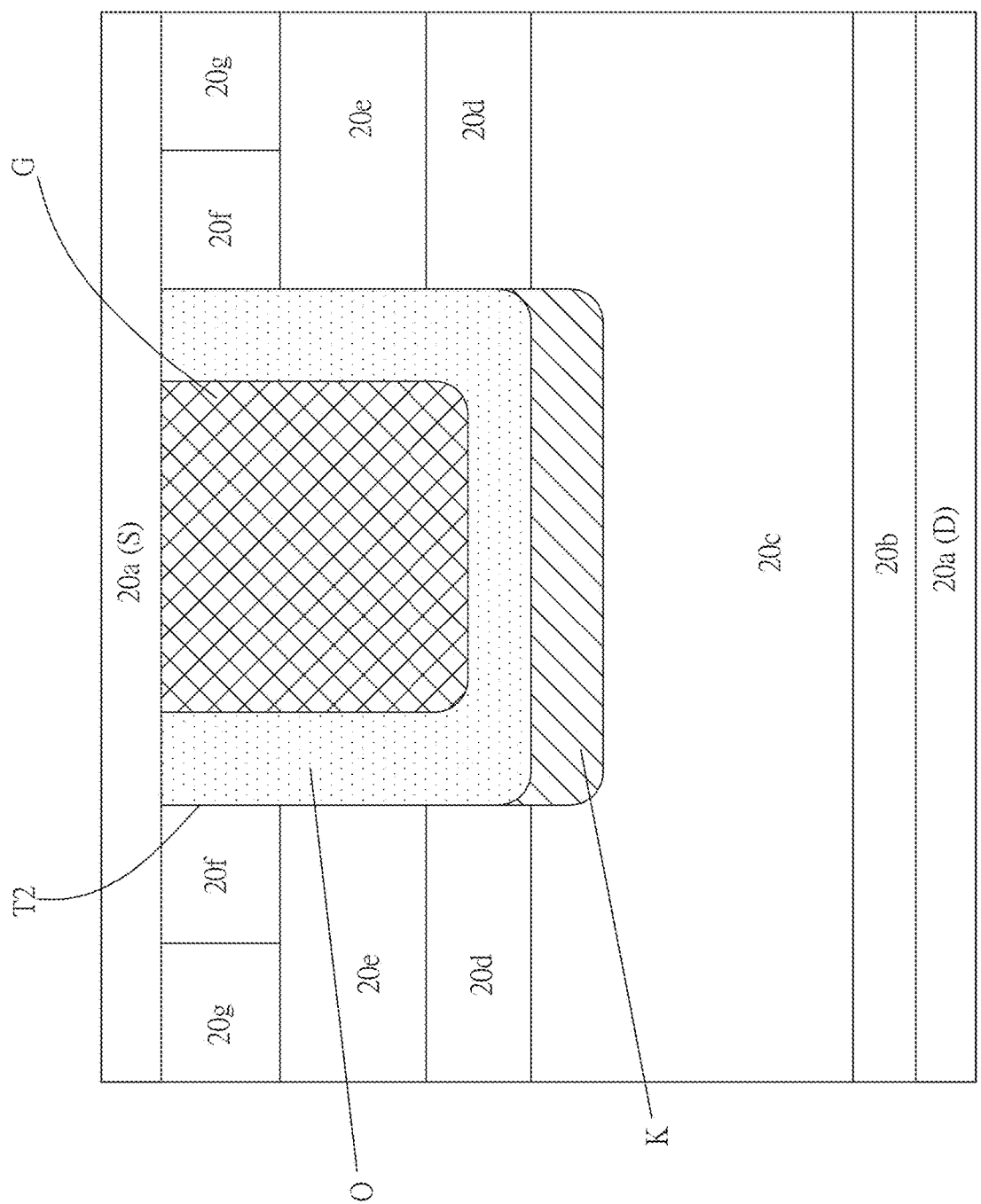
FIGS. 3 to 5 are schematic cross-sectional views taken along a line A-A' of FIG. 1 to show three schematic structures of each UMOS.
Figure 4:
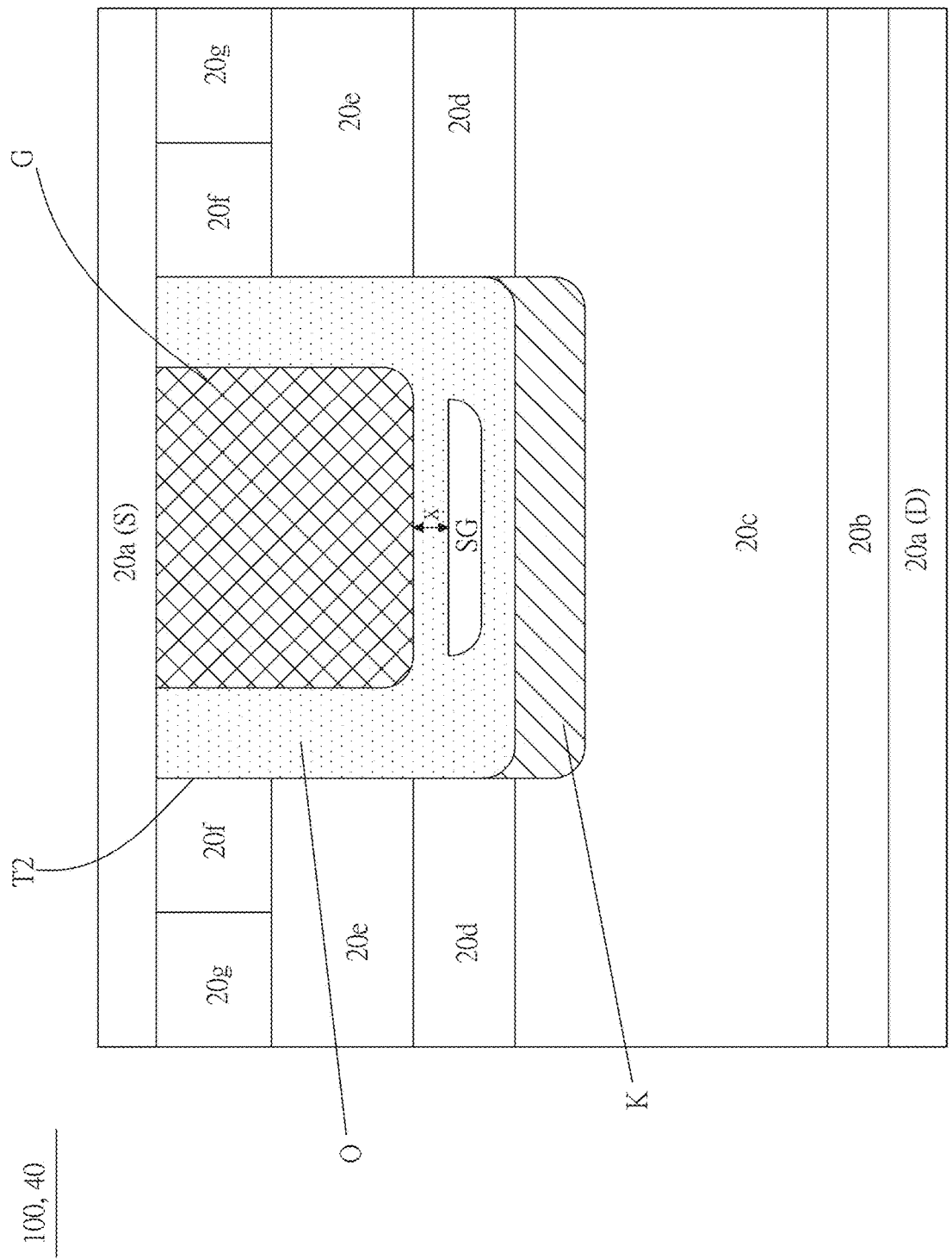

FIG. 1 is a schematic top view showing a semiconductor device 100 with a TJBS diode according to an embodiment of the invention. As shown in FIG. 1, a distance C1 denotes a trench width of each of UMOS structures 30 (as shown in FIG. 3), 40 (as shown in FIG. 4) and 50 (FIG. 5), and a distance C2 denotes a trench width of a TJBS diode 10 (as shown in FIG. 2).

Please note that each unit of the semiconductor structure 100 is a structure formed by connecting the UMOS structure to the TJBS diode in parallel.

Figure 2:
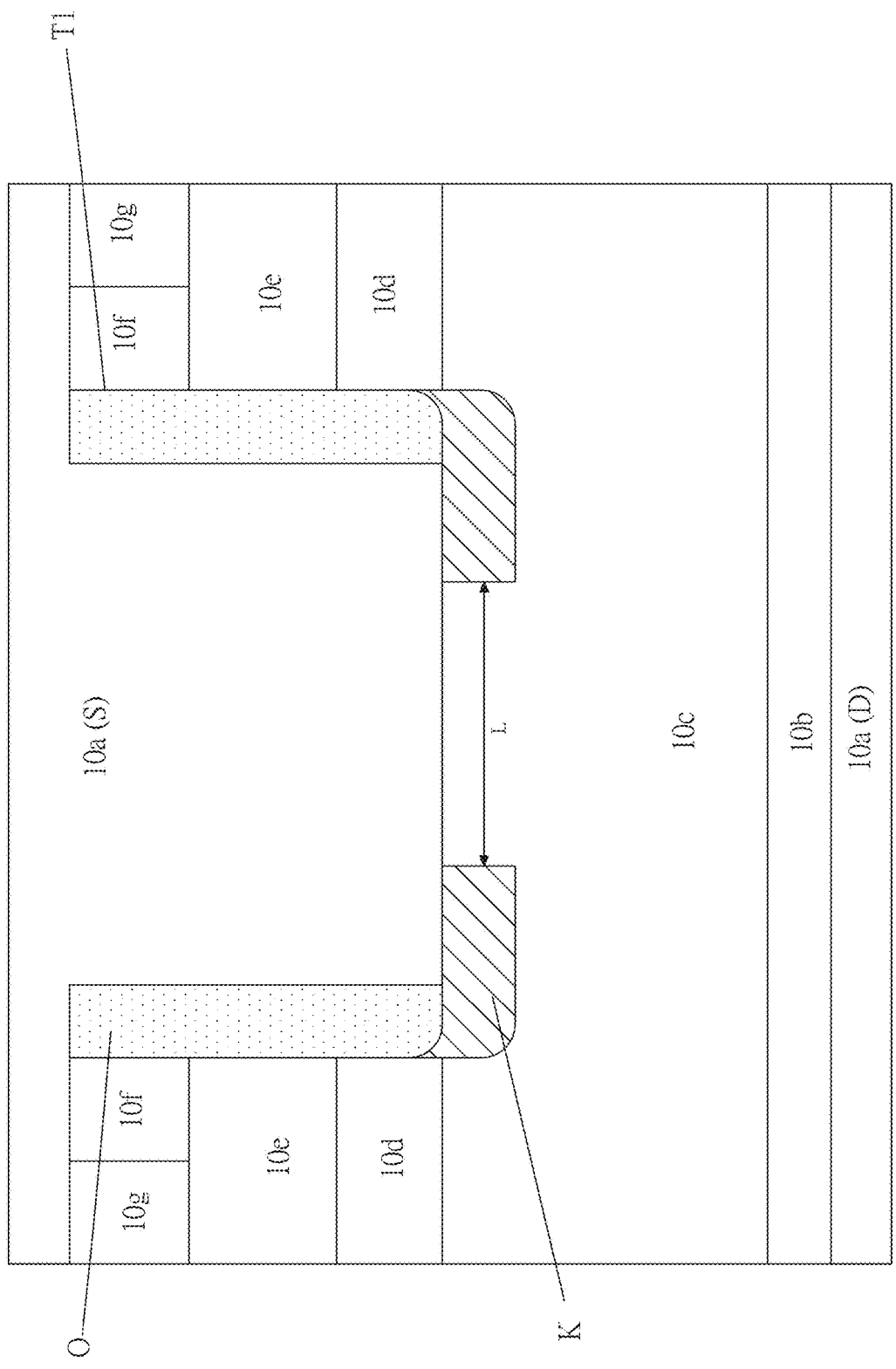
FIG. 2 is a schematic cross-sectional view taken along a line A-B of FIG. 1.

FIG. 2 is a schematic cross-sectional view taken along a line A-B of FIG. 1. Referring to FIG. 2, the semiconductor structure 100 includes the TJBS diode 10, and the TJBS diode 10 includes: a metal layer 10a, an N-type semiconductor substrate 10b, an N-drift region 10c, an N-current spread layer (N-CSL) 10d, a P-well 10e, a trench T1, an insulating layer O and a P-type semiconductor protection layer K.

The metal layer 10a is disposed on the top surface and the bottom surface of the TJBS diode 10 to form a source S and a drain D, respectively. The N-type semiconductor substrate 10b is disposed on the drain D. The N-drift region 10c is disposed on the N-type semiconductor substrate 10b. The N-CSL 10d is disposed on the N-drift region 10c. The P-well 10e is disposed on the N-CSL 10d. An N-type semiconductor layer 10f and a P-type semiconductor layer 10g are disposed on the P-well 10e.

In addition, the trench T1 extends through the N-type semiconductor layer 10f, the P-well 10e and the N-CSL 10d from the bottom surface of the metal layer 10a (the source 5), and the bottom of the trench T1 terminates at the N-drift region 10c.

The insulating layer O is disposed on two sidewalk in the trench T1, the metal layer 10a of the source S extends into the trench T1, and two sides of the metal layer 10a in the trench T1 contact the insulating layer O of the two sidewalls of the trench T1.

The P-type semiconductor protection layer K is disposed below the bottom of the trench T1 and on two sides of the bottom of the trench T1 and is adjacent to the N-drift region 10c. The insulating layer O is disposed above the P-type semiconductor protection layer K. A gap L is formed between two portions of the P-type semiconductor protection layer K, and the bottom surface of the metal layer 10a (the source 5) in the trench T1 is disposed above the gap L. The insulating layer O prevents the side surface of the metal layer 10a in the trench T1 from contacting the P-well 10e, the N-CSL 10d or the N-type semiconductor layer 10f.

In another embodiment, the other sidewall of the insulating layer O contacts the P-well 10e, the N-CSL 10d and the N-type semiconductor layer 10f, and the bottom of the insulating layer O contacts a portion of the top surface of the P-type semiconductor protection layer K. The N-drift region 10c has a projection having a width equal to that of the gap L.

The structure of the TJBS diode 10 can control the current to flow out of the bottom surface of the metal layer 10a. (the source S), so the current path flowing from the source S through the gap L is a vertical path. Because the Schottky barrier is located at the junction between the lowest point of the metal layer 10a of the source S and the N-drift region 10c, its current path is shortest and perpendicular to the horizontal surface or the Schottky barrier.

In addition, the insulating layer O of the sidewall of the structure of the TJBS diode 10 does not have a side gate, so the area of the TJBS diode 10 can be decreased.

FIG. 3 is a schematic cross-sectional view taken along a line A-A' of FIG. 1 to show the UMOS structure of the semiconductor structure 100 according to the embodiment. Referring concurrently to FIG. 3, the UMOS structure 30 includes: a metal layer 20a, an N-type semiconductor substrate 20b, an N-drift region 20c, an N-CSL 20d, a P-well 20e, a trench T2, the insulating layer O, a gate G and the P-type semiconductor protection layer K.

The metal layer 20a is disposed on the top surface and the bottom surface of the UMOS structure 30 to form the source S and the drain D, respectively, and the source S and the drain D serve as electrodes connected in parallel to the UMOS structure 30 and the TJBS diode 10. The N-type semiconductor substrate 20b is disposed on the drain D of the UMOS structure 30. The N-drift region 20c is disposed on the N-type semiconductor substrate 20b of the UMOS structure 30. The N-CSL 20d is disposed on the N-drift region 20c. The P-well 20e is disposed on the N-CSL 20d. An N-type semiconductor layer 20f and a P-type semiconductor layer 20g are disposed on the P-well 20e.

In addition, the trench T2 extends from the bottom surface of the metal layer 20a (the source S) of the UMOS structure 30 through the N-type semiconductor layer 20f, the P-well 20e and the N-CSL 20d. The bottom of the trench T2 terminates at the N-drift region 20c.

The insulating layer O is disposed in the trench T2. The gate G is disposed in the insulating layer O of the trench T2 and is covered by the insulating layer O. The P-type semiconductor protection layer K is disposed below the bottom of the trench T2 and adjacent to the N-drift region 20c, and the insulating layer O is disposed above the P-type semiconductor protection layer K.

The P-type semiconductor protection layer K is disposed below the bottom of the trench T1 and on two sides of the bottom of the trench T1, and is adjacent to the N-drift region 20c. The insulating layer O is disposed above the P-type semiconductor protection layer K.

FIG. 4 is a schematic view showing a UMOS structure of the semiconductor structure according to an embodiment. Referring concurrently to FIG. 4, a UMOS structure 40 differs from the UMOS structure 30 in that the UMOS structure 40 further includes a split gate SG, which is disposed in the insulating layer O of the trench T2 and covered by the insulating layer O.

In addition, the gate G is separated from the split gate SG by the insulating layer O and by a predetermined gap X. A depth position of the bottom of the gate G is deeper than that of an interface between the P-well 20e and the N-CSL 20d.

Figure 5:
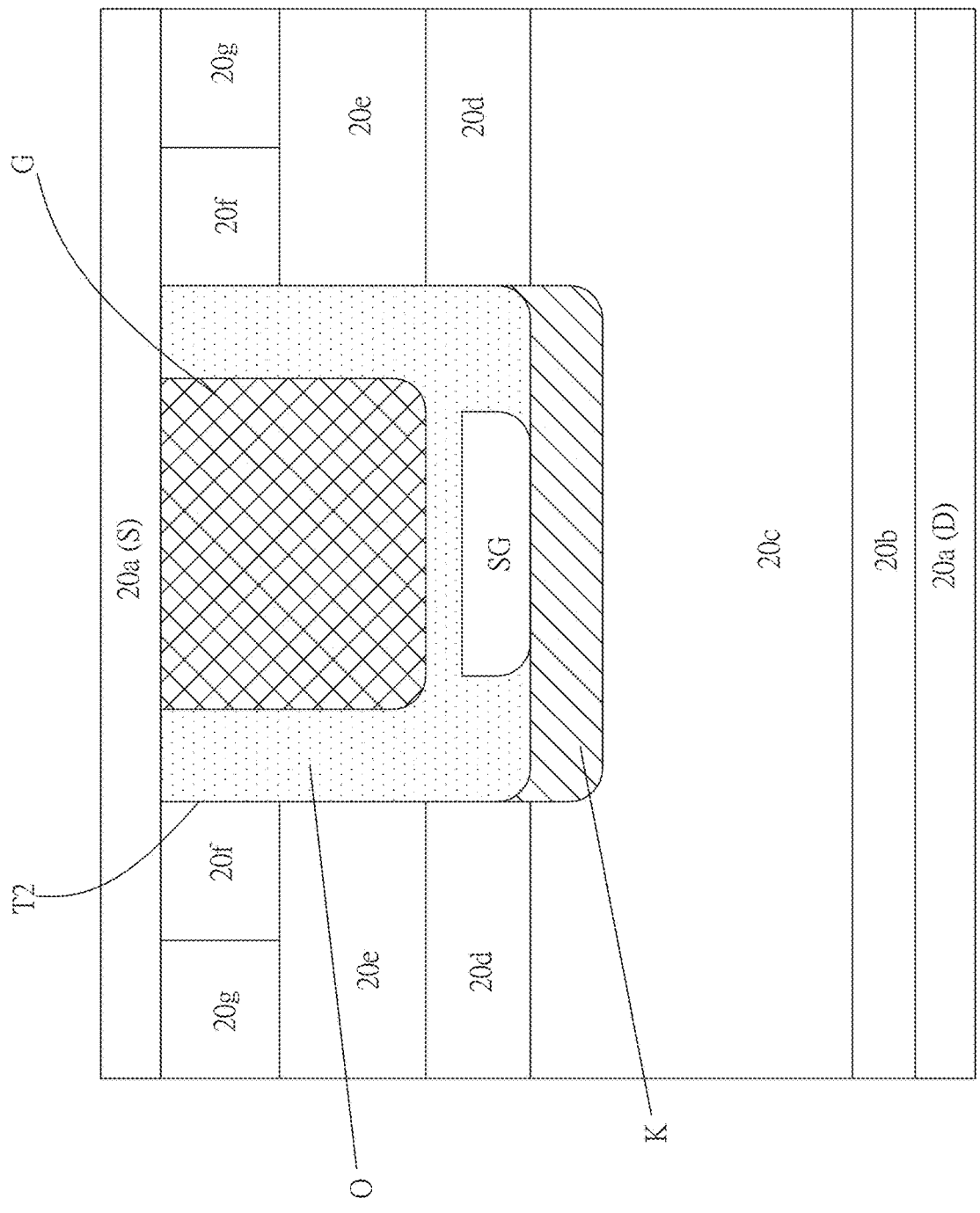

FIG. 5 is a schematic view showing a UMOS structure of the semiconductor structure according to an embodiment. Referring concurrently to FIG. 5, a UMOS structure 50 differs from the UMOS structure 40 in that the bottom of the split gate SG of the UMOS structure 50 contacts the top surface of the P-type semiconductor protection layer K.

Figure 6:
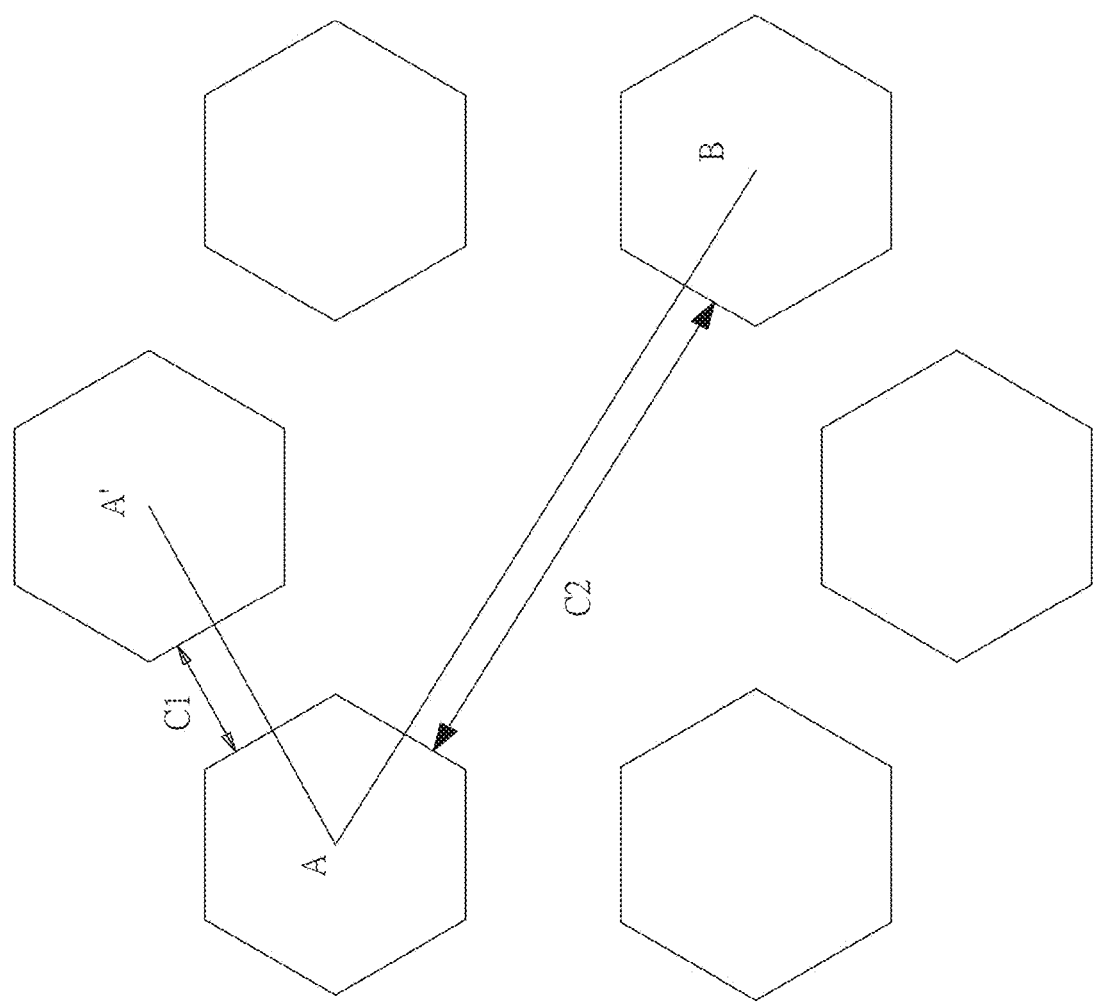
FIGS. 6 to 7 are schematic top views showing an embodiment of the invention.
Figure 7:
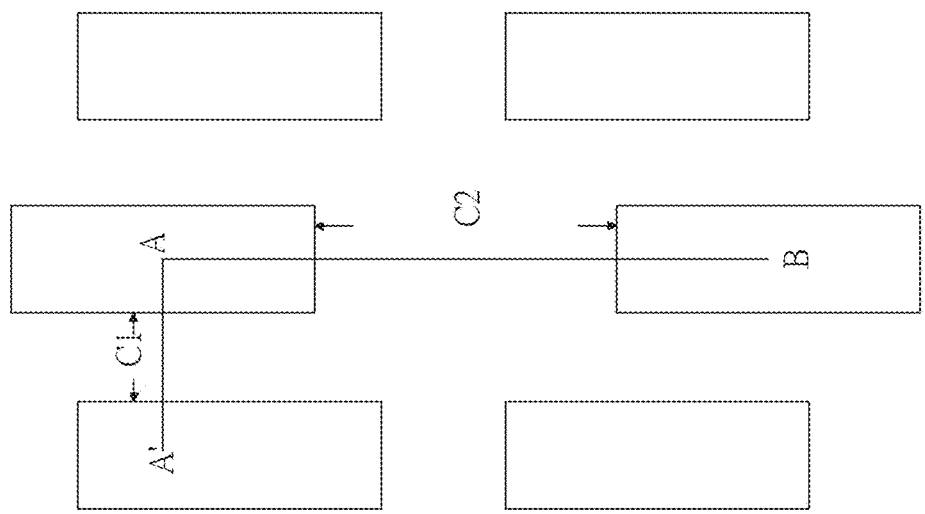

FIGS. 6 to 7 are schematic top views showing an embodiment of the invention. Referring concurrently to FIGS. 6 and 7, a semiconductor structure 600 of FIG. 6 may have a hexagonally arranged structure, and a semiconductor structure 700 of FIG. 7 may have a longitudinally staggered structure.

In summary, the semiconductor structure of the invention has the TJBS diode connected in parallel to the field effect transistor of the UMOS structure. The Schottky barrier is located at the lowest position of the metal layer of the diode (the bottom of the trench), and disposed at the junction between the metal layer and the N-drift region. Thus, the invention has the shortest current path, and the current path is perpendicular to the horizontal surface or the Schottky barrier.

What is claimed is:

1. A semiconductor structure, comprising a diode structure, the diode structure comprising:

a first metal layer disposed on a top surface and a bottom surface of the diode structure to form a source and a drain, respectively;

a first N-type semiconductor substrate disposed on the drain;

a first N-drift region disposed on the first N-type semiconductor substrate;

a first N-current spread layer (N-CSL) disposed on the first N-drift region;

a first P-well disposed on the first N-CSL;

a first N-type semiconductor layer disposed on the first P-well;

a first P-type semiconductor layer disposed on the first P-well;

a first trench extending through the first N-type semiconductor layer, the first P-well and the first N-CSL, wherein a bottom of the first trench terminates at the first N-drift region;

a first insulating layer disposed on two sidewalls in the first trench, wherein the first metal layer of the source extends into the first trench, and two sides of the first metal layer in the first trench contact the first insulating layer of the two sidewalls; and a first P-type semiconductor protection layer disposed below the bottom of the first trench and on two sides of the bottom of the first trench, and adjacent to the first N-drift region, wherein the first insulating layer is disposed above the first P-type semiconductor protection layer, a gap is formed between two portions of the first P-type semiconductor protection layer, and the first metal layer in the first trench is disposed above the gap; wherein the first insulating layer prevents one side surface of the first metal layer in the first trench from contacting the first P-well, the first N-CSL, or the first N-type semiconductor layer.

2. The semiconductor structure according to claim 1, wherein the first trench is a U-shaped trench.

3. The semiconductor structure according to claim 2, wherein a current path flowing from the source through the gap is a vertical path.

4. The semiconductor structure according to claim 3, wherein the semiconductor structure comprises a UMOS structure, and the UMOS structure comprises:

a second metal layer disposed on a top surface and a bottom surface of the UMOS structure to respectively form the source and the drain serving as electrodes connected in parallel to the UMOS structure and the diode structure;

a second N-type semiconductor substrate disposed on the drain of the UMOS structure;

a second N-drift region disposed on the second N-type semiconductor substrate of the UMOS structure;

a second N-CSL disposed on the second N-drift region;

a second P-well disposed on the second N-CSL;

a second N-type semiconductor layer disposed on the second P-well;

a second P-type semiconductor layer disposed on the second P-well;

a second trench extending through the second N-type semiconductor layer and the second N-CSL, wherein a bottom of the second trench terminates at the second N-drift region;

a second insulating layer disposed in the second trench;

a gate disposed on the second insulating layer of the second trench and covered by the second insulating layer; and a second P-type semiconductor protection layer disposed below the bottom of the second trench and adjacent to the second N-drift region, wherein the second insulating layer is disposed above the second P-type semiconductor protection layer.

5. The semiconductor structure according to claim 3, wherein the semiconductor structure comprises a UMOS structure, and the UMOS structure comprises:
a second metal layer disposed on a top surface and a bottom surface of the UMOS structure to respectively form the source and the drain serving as electrodes connected in parallel to the UMOS structure and the diode structure;
a second N-type semiconductor substrate disposed on the drain of the UMOS structure;
a second N-drift region disposed on the second N-type semiconductor substrate of the UMOS structure;
a second N-CSL disposed on the second N-drift region;
a second P-well disposed on the second N-CSL;
a second N-type semiconductor layer disposed on the second P-well;
a second P-type semiconductor layer disposed on the second P-well;
a second trench extending through the second N-type semiconductor layer and the second N-CSL, wherein a bottom of the second trench terminates at the second N-drift region;
a second insulating layer disposed in the second trench;
a split gate disposed on the second insulating layer of the second trench and covered by the second insulating layer;
a gate, which is disposed in the second insulating layer of the second trench and above the split gate, and covered by the second insulating layer; and
a second P-type semiconductor protection layer disposed below the bottom of the second trench and adjacent to the second N-drift region, wherein the second insulating layer is disposed above the second P-type semiconductor protection layer;
wherein the gate is separated from the split gate by the second insulating layer and by a predetermined gap; and a depth position of a bottom of the gate is deeper than a depth position of an interface between the second P-well and the second N-CSL.

6. The semiconductor structure according to claim 3, wherein the semiconductor structure comprises a UMOS structure, and the UMOS structure comprises:
a second metal layer disposed on a top surface and a bottom surface of the UMOS structure to respectively form the source and the drain serving as electrodes of the UMOS structure and the diode structure;
a second N-type semiconductor substrate disposed on the drain of the UMOS structure;
a second N-drift region disposed on the second N-type semiconductor substrate of the UMOS structure;
a second N-CSL disposed on the second N-drift region;
a second P-well disposed on the second N-CSL;
a second N-type semiconductor layer disposed on the second P-well;
a second P-type semiconductor layer disposed on the second P-well;
a second trench extending through the second N-type semiconductor layer and the second N-CSL, wherein a bottom of the second trench terminates at the second N-drift region;
a second insulating layer disposed in the second trench;
a split gate disposed on the second insulating layer of the second trench and covered by the second insulating layer;
a gate, which is disposed in the second insulating layer of the second trench and above the split gate, and covered by the second insulating layer; and
a second P-type semiconductor protection layer disposed below the bottom of the second trench and adjacent to the second N-drift region, wherein the second insulating layer is disposed above the second P-type semiconductor protection layer;
wherein the gate is separated from the split gate by the second insulating layer and by a predetermined gap; and a depth position of a bottom of the gate is deeper than a depth position of an interface between the second P-well and the second N-CSL, and a bottom of the split gate contacts a top surface of the second P-type semiconductor protection layer.

* * * * *